United States Patent
Yokoyama (10) Patent No.: US 8,431,439 B2
(45) Date of Patent: Apr. 30, 2013

(54) THIN FILM LAMINATED BODY MANUFACTURING APPARATUS AND METHOD

(75) Inventor: Shoji Yokoyama, Hachiouji (JP)

(73) Assignee: Fuji Electric Co., Ltd., Kawasaki-Shi (JP)

(*) Notice: Subject to any disclaimer, the term of this patent is extended or adjusted under 35 U.S.C. 154(b) by 393 days.

(21) Appl. No.: 12/676,103

(22) PCT Filed: Mar. 2, 2009

(86) PCT No.: PCT/JP2009/053876
§ 371 (c)(1),
(2), (4) Date: Nov. 26, 2010

(87) PCT Pub. No.: WO2009/122836
PCT Pub. Date: Oct. 8, 2009

(65) Prior Publication Data
US 2011/0086457 A1  Apr. 14, 2011

(30) Foreign Application Priority Data
Mar. 31, 2008 (JP) .................................. 2008-091032

(51) Int. Cl.
*H01L 21/00* (2006.01)
*C23C 16/00* (2006.01)

(52) U.S. Cl.
USPC ............ 438/111; 438/110; 118/719; 118/729

(58) Field of Classification Search ............... 438/110, 438/111; 118/719, 729
See application file for complete search history.

(56) References Cited

U.S. PATENT DOCUMENTS

| | | | | |
|---|---|---|---|---|
| 3,586,229 A | * | 6/1971 | Kamada et al. | 226/180 |
| 5,114,770 A | * | 5/1992 | Echizen et al. | 427/575 |
| 6,235,634 B1 | * | 5/2001 | White et al. | 438/680 |
| 2009/0047114 A1 | * | 2/2009 | Yokoyama et al. | 414/806 |

FOREIGN PATENT DOCUMENTS

| | | |
|---|---|---|
| JP | 58-007502 Y2 | 2/1983 |
| JP | 07-326781 A | 12/1995 |
| JP | 08-244123 A | 9/1996 |
| JP | 08-246150 A | 9/1996 |
| JP | 2001-223375 A | 8/2001 |
| JP | 2005-072408 A | 3/2005 |
| JP | 2009-038276 A | 2/2009 |
| JP | 2009-057632 A | 3/2009 |

* cited by examiner

*Primary Examiner* — Jarrett Stark
*Assistant Examiner* — Nicholas Tobergte
(74) *Attorney, Agent, or Firm* — Rabin & Berdo, P.C.

(57) ABSTRACT

A strip-shape flexible substrate is transported over a long horizontal distance, with its width extending in the vertical direction, the position of the substrate in the vertical direction is maintained with high precision, and the films are deposited onto its surface. When depositing the thin films to manufacture a thin film laminated body, at least one pair of gripping rollers arranged in at least one space between film deposition chambers, and which grasps an upper-side edge portion of the substrate with its width oriented in the vertical direction, are installed such that the rotation direction of the gripping rollers is diagonally upward, at an angle relative to the direction of transport of the substrate, and by changing the force with which the gripping rollers grasp the substrate, a force lifts the substrate, and the height of the substrate can be controlled.

12 Claims, 8 Drawing Sheets

THIN FILM LAMINATED BODY MANUFACTURING APPARATUS AND METHOD

TECHNICAL FIELD

This invention relates to an apparatus and method for forming a plurality of thin films on a strip-shape flexible substrate, and manufacturing thin film laminated bodies such as thin film photoelectric conversion elements.

BACKGROUND ART

Substrates with high rigidity are normally used as the substrates of semiconductor thin film and other thin film laminated bodies. However, flexible substrates of resins or similar materials are also used as the substrates of photoelectric conversion elements used in solar cells, for example, due to their light weight, ease of handling and other convenient features, as well as reduced costs through mass production.

As apparatuses for manufacturing thin film laminated bodies using such flexible substrates, film deposition apparatuses have been developed in which a strip-shape flexible substrate is passed through a plurality of film deposition chambers arranged consecutively, and an operation is repeated in which, while in a stopped state in each film deposition chamber, film is deposited onto the surface of the substrate, after which the substrate is transported to the position of the next film deposition chamber, to deposit a plurality of thin films with different properties onto the substrate (see, for example, Japanese Patent Application Laid-open No. 2005-72408).

Among such film deposition apparatuses, there are types which hold the strip-shape flexible substrate with the width direction extending in a horizontally and transport the substrate in a horizontal direction to perform film deposition, and also types which hold a strip-shape flexible substrate with the width direction extending vertically, and transport the substrate in a horizontal direction to perform film deposition. The latter type has such advantages as a reduced tendency for contamination of the substrate surface compared with the former type; but when the number of deposition chambers increases, there are the problems that gravity and elongation of the substrate cause wrinkles to occur in the surface of the substrate, or the substrate undulates in the width direction, or droops downward.

In order to resolve such problems, it has been proposed that an intermediate chamber be placed between two deposition chambers positioned in the center of an arrangement of numerous other deposition chambers, and that at this place a side edge position control (EPC) roller, which is in contact with the substrate surface across the entire surface in the width direction of the substrate, be provided. However, normally film deposition is performed at comparatively high temperatures, and if such a stainless steel EPC roller were placed between deposition chambers, such problems as the occurrence of rapid cooling of the substrate and folding wrinkles may occur.

Further, in order to prevent folding wrinkles in the substrate due to the EPC roller in the intermediate chamber, it has been proposed that the EPC roller in the intermediate chamber be eliminated, and that an edge portion of the substrate be gripped by a gripping roller and transported. However, to the extent that restraints on the substrate by the EPC roller in the intermediate chamber are removed, the effects of variation in the initial properties of the substrate itself are more readily exerted. This problem becomes prominent when the number of deposition chambers in a line is increased and the line length is extended in order to raise the production efficiency of the line; the amount of meandering in the height direction of the substrate during transport increases, and variation in the deposition positions on the film becomes larger.

Further, in the initial period of film deposition, all the prescribed thin film layers cannot be deposited on the portion of the substrate positioned from the first deposition chamber to the last deposition chamber. Hence, during the time until the substrate portion on which film is deposited in the first deposition chamber reaches the takeup core (that is, the length of one entire film pass), the properties of the substrate on which all the prescribed thin film layers have been deposited change. Consequently, the prescribed target height of the substrate, over the length from the feeding position to the takeup position in this film deposition initial period, increases or decreases in the width direction. Also, the substrate must be transported over a long period of time until the substrate height converges on the prescribed height.

DISCLOSURE OF THE INVENTION

Hence, in light of the above problems, an object of this invention is to provide a thin film laminated body manufacturing apparatus and method which, when transporting a strip-shape flexible substrate over a long distance in a horizontal direction with the width direction of the substrate being vertical, can prevent meandering in the width direction and drooping downward of the substrate, even when the process length is made longer to raise production efficiency, and even when substrate on which film deposition is not performed during the film deposition initial period is transported over a long distance.

In order to attain the above object, as one mode of the invention, an apparatus to manufacture a thin film laminated body, which deposits a plurality of thin films onto the surface of a strip-shape flexible substrate, is characterized in comprising: substrate transportation means for transporting the substrate in a horizontal direction, with the width direction of the substrate being vertical; a plurality of film deposition chambers, which are arranged consecutively along the direction of transport of the substrate, and in which film deposition onto the surface of the substrate is performed; at least one pair of gripping rollers, which is arranged in at least one space among spaces between the film deposition chambers, and which grasps an edge portion of the substrate on the upper side in the vertical direction, with the gripping roller rotation direction being diagonally upward relative to the direction of substrate transport; and control means for controlling the height of the substrate by changing the force with which at least one pair of gripping rollers grasps the substrate.

Further, as another mode of the invention, an apparatus to manufacture a thin film laminated body, which deposits a plurality of thin films onto the surface of a strip-shape flexible substrate, is characterized in comprising: substrate transportation means for transporting the substrate in a horizontal direction, with the width direction of the substrate being vertical; a plurality of film deposition chambers, which are arranged consecutively along the direction of transport of the substrate, and in which film deposition onto the surface of the substrate is performed; a plurality of pairs of gripping rollers, which are arranged in the spaces between the respective film deposition chambers, and which grasp the edge portion of the substrate on the upper side in the vertical direction; at least two pairs of gripping rollers, which are arranged in at least one space between the plurality of film deposition chambers, and which grasp each of the edge portions of the substrate on the upper side and on the lower side in the vertical direction, with the upper-side pair gripping roller rotation direction being diagonally upward relative to the direction of substrate transport, and with the lower-side pair gripping roller rotation direction being diagonally downward relative to the direction of substrate transport; and control means for controlling the height of the substrate by changing the force with which at least one pair of gripping rollers among the upper-side and lower-side pairs of gripping rollers grasps the substrate.

It is preferable that an apparatus to manufacture thin film laminated bodies further comprise an actuator that changes the gripping force of the gripping rollers grasping the substrate; powering means for inputting energy to the actuator; and a load cell that detects the energy input to the actuator. And, it is preferable that, in order to set the gripping force of the gripping rollers grasping the substrate to a target value, the control device calculates a target value of the energy to be input to the actuator, and after the input energy at the target value has been input to the actuator by the powering means, compares a detected value of the input energy detected by the load cell with the input energy target value, and changes the target value for energy to be input to the actuator.

Further, it is preferable that an apparatus to manufacture thin film laminated bodies further comprise a sensor that detects the height of the substrate, and it is preferable that the control device change the target value for the gripping force of the gripping rollers grasping the substrate when a judgment is made by the sensor that the height of the substrate detected is not within a prescribed range.

Further, as another mode of the invention, a method of manufacturing a thin film laminated body, in which a plurality of thin films are deposited onto the surface of a strip-shape flexible substrate, is characterized in comprising: a step of transporting the substrate in a horizontal direction, with the width of the substrate extending in the vertical direction; a step of performing film deposition onto the surface of the substrate in use of a plurality of film deposition chambers, arranged consecutively along the substrate transport direction; and a step of controlling the height of the substrate by changing the force with which the substrate is grasped by at least one pair of gripping rollers, which are arranged in at least one space among the spaces between the film deposition chambers, and which grasp the edge portion of the substrate on the upper side in the vertical direction, with the gripping roller rotation direction being diagonally upward relative to the direction of substrate transport.

Further, as still another mode of the invention, a method of manufacturing a thin film laminated body, in which a plurality of thin films are deposited onto the surface of a strip-shape flexible substrate, is characterized in comprising: a step of transporting the substrate in a horizontal direction, with the width direction of the substrate extending in the vertical direction; a step of performing film deposition onto the surface of the substrate in use of a plurality of film deposition chambers, arranged consecutively along the substrate transport direction; and a step of controlling the height of the substrate by changing the force with which the substrate is grasped for at least one of two pairs of gripping rollers, which are arranged in at least one space among the spaces between the film deposition chambers, and which grasp the edge portions of the substrate on the upper side and on the lower side in the vertical direction, with the upper-side pair gripping roller rotation direction being diagonally upward relative to the direction of substrate transport, and with the lower-side pair gripping roller rotation direction being diagonally downward relative to the direction of substrate transport.

It is preferable that the step of controlling the height of the substrate further comprise a step, in order to set the force of the gripping rollers grasping the substrate to a target value, of calculating a target value of the energy input to an actuator which changes the force with which the gripping rollers grasp the substrate; inputting an energy target value to the actuator by powering means; and detecting the energy input to the actuator in use of a load cell, comparing the detected value of the input energy with the input energy target value, and changing the target value for energy to be input to the actuator.

Further, it is preferable that the step of controlling the height of the substrate comprise: a step of detecting the height of the substrate in use of a sensor and judging whether the substrate height is within a prescribed range, and a step, when a judgment is made that the substrate height is not within the prescribed range, of changing the target value of the force with which the gripping rollers grasp the substrate.

In this way, gripping rollers placed between film deposition chambers which grasp an edge of the substrate in a vertical direction are positioned with the rotation direction diagonal to the direction of transport of the substrate, and by changing the force with which the substrate is grasped, the height of the substrate can be controlled, so that even when a strip-shape flexible substrate is transported over a long distance through a plurality of film deposition chambers, meandering in the width direction and drooping downward of the substrate can be prevented.

BEST MODE FOR CARRYING OUT THE INVENTION

Below, an embodiment of an apparatus for the manufacture of thin film laminated bodies of this invention is explained, referring to the attached drawings. Here the specific configuration of the thin film laminated body is not discussed in particular, but this invention can for example be applied to apparatuses for the manufacture of photoelectric converter elements for solar cells, organic ELs and other semiconductor thin films, and other thin film laminated bodies.

Figure 1:
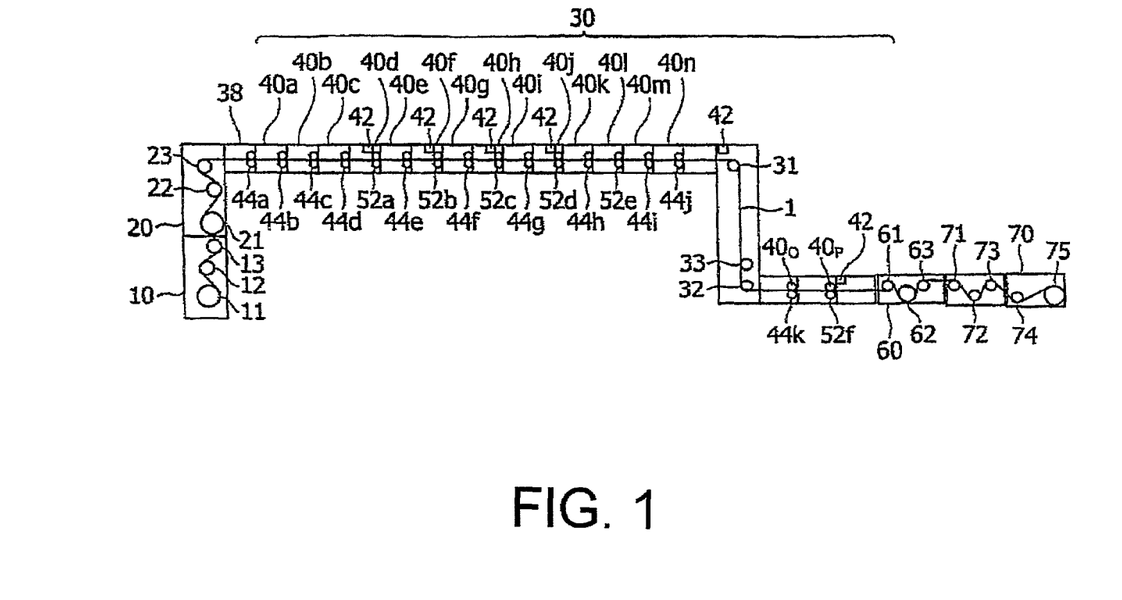
FIG. 1 is a plan view schematically showing one embodiment of an apparatus for the manufacture of thin film laminated bodies of the invention.

FIG. 1 is a plan view schematically showing an embodiment of an apparatus for the manufacture of thin film laminated bodies of the invention. The figure is distorted, and is not drawn to scale.

As shown in FIG. 1, the apparatus for the manufacture of thin film laminated bodies mainly comprises a feed portion 10 which feeds the strip-shape flexible substrate 1; a feed-side driving portion 20, which transports the strip-shape flexible substrate 1 from the feed portion to the film deposition portion; a film deposition portion 30, which deposits a plurality of thin films on the strip-shape flexible substrate 1; a takeup-side driving portion 60, which transports the strip-shape flexible substrate 1 from the film deposition portion to the takeup portion; and a takeup portion 70, which takes up the strip-shape flexible substrate 1 on which the thin film laminated body has been formed. The strip-shape flexible substrate 1 is transported in a horizontal direction with the width extending in the vertical direction.

The feed portion 10 is provided with a feed core 11, which feeds the strip-shape flexible substrate 1 from a feed roll on which the strip-shape flexible substrate is wound in roll form; tension detection roller 13, which detects the tension of the strip-shape flexible substrate 1 fed from the feed core 11; and free roller 12, positioned therebetween. The feed core 11, free roller 12, and tension detection roller 13 are each installed such that the axis direction is the vertical direction. In the following explanation, unless stipulated otherwise, each of these rollers is installed with a vertical axis.

The feed-side driving portion 20 is provided with a feed-side film driving roller 21, which performs driving in rotation to transport the strip-shape flexible substrate 1 from the feed portion 10 toward the film deposition portion 40; a tension detection roller 22, which detects the tension of the strip-shape flexible substrate 1 during this driving; and a free roller 23, which changes the direction of advance of the strip-shape flexible substrate 1 by 90° and sends the substrate to the film deposition portion 40.

The film deposition portion 30 is provided with a preheating chamber 38, and a plurality of film deposition chambers 40a to 40p to deposit thin films in order onto the surface of the strip-shape flexible substrate 1. The film deposition chambers 40 are provided with CVD, sputtering, or other film deposition apparatuses, according to the type of thin film to be formed. In this embodiment, CVD film deposition apparatuses are provided in the first 14 film deposition chambers 40a to 40n, arranged in a straight line, and sputtering film deposition apparatuses are provided in the final two film deposition chambers 40o, 40p. Between the CVD film deposition chambers and the sputtering film deposition chambers are provided two free rollers 31, 32, which change the direction of advance by 90°. And, in the film deposition chambers are provided movable walls (not shown), to create an airtight state in the film deposition chambers.

Each of the film deposition chambers 40 is provided with a pair of gripping rollers 44 or 52, on the substrate entry side of the film deposition chamber, which grasp the strip-shape flexible substrate 1. While described in detail below, the gripping rollers are fixed-type gripping rollers 44, which apply a fixed force to the substrate 1, and variable-type gripping rollers 52, the force applied to the substrate 1 by which can be controlled. Variable-type gripping rollers 52 are provided to the fourth, sixth, eighth, tenth, and sixteenth film deposition chambers 40d, 40f, 40h, 40j, 40p, and fixed-type gripping rollers 44 are installed in the remaining film deposition chambers. While described in detail below, edge face sensors 42 which detect the upper-side edge face of the strip-shape flexible substrate 1 are provided in each of the film deposition chambers in which variable-type gripping rollers 52 are installed.

The takeup-side driving portion 60 is provided with a takeup-side film-driving roller 62, which performs driving in rotation to transport the strip-shape flexible substrate 1 from the film deposition portion 40 to the takeup portion 70, and free rollers 61, 63 positioned before and after the takeup-side film-driving roller 62. The takeup portion 70 is provided with a tension detection roller 72, to control the tension of the strip-shape flexible substrate 1 at the time of takeup; free rollers 71, 73, positioned before and after the tension detection roller 72; a takeup core 75, which takes up in roll form the strip-shape flexible substrate 1, on which the thin film laminated body has been formed; and, a free roller 74 positioned before the takeup core 75.

Figure 2:
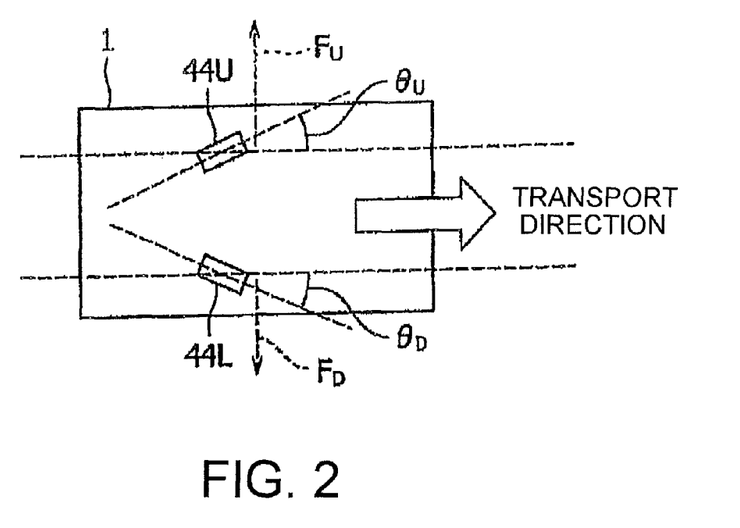
FIG. 2 is a front view showing in enlargement a strip-shape flexible substrate and fixed-type gripping rollers in the apparatus shown in FIG. 1.
Figure 3:
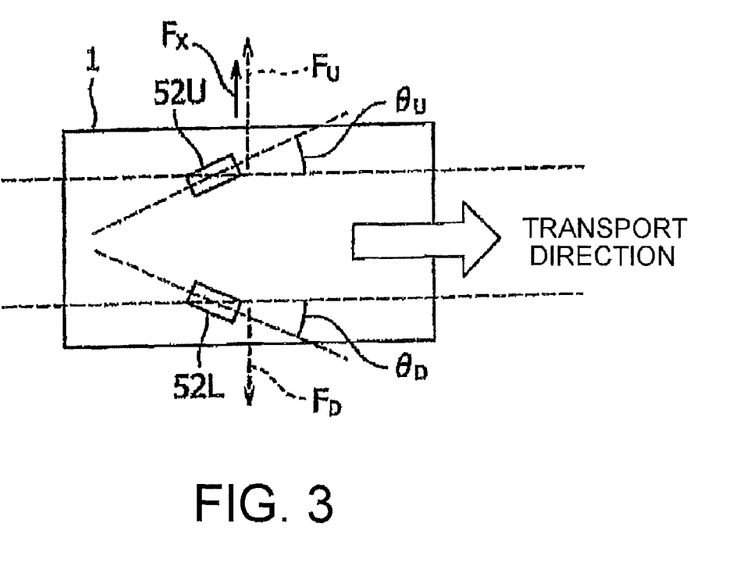
FIG. 3 is a front view showing in enlargement a strip-shape flexible substrate and variable-type gripping rollers in the apparatus shown in FIG. 1.

Next, the gripping rollers are described in detail. FIG. 2 is a front view showing in enlargement the strip-shape flexible substrate 1 and fixed-type gripping rollers 44 in the manufacturing apparatus of FIG. 1. And, FIG. 3 is a front view showing in enlargement the strip-shape flexible substrate 1 and variable-type gripping rollers 52 in the manufacturing apparatus of FIG. 1. All of the gripping rollers 44 and 52 are placed at both the upper-side edge portion and at the lower-side edge portion in the vertical direction of the strip-shape flexible substrate 1, as shown in FIG. 2 and FIG. 3. And as shown in FIG. 2 and FIG. 3, all of the gripping rollers are installed diagonally, at an angle θ with respect to the transport direction, which is the horizontal direction.

As shown in FIG. 2, the upper-side fixed-type gripping rollers 44U are installed with the rotation direction of the rollers inclined upward with respect to the transport direction of the strip-shape flexible substrate 1 (that is, the horizontal direction). By thus causing the rotation direction of the upper-side fixed-type gripping rollers 44U to make an angle $\theta_U$ with the direction of transport of the strip-shape flexible substrate 1, a force $F_U$ occurs which pulls the substrate 1 upward when the strip-shape flexible substrate 1 is transported in the horizontal direction. And, the lower-side fixed-type gripping rollers 44L are similarly installed inclined downward at an angle $\theta_L$, so that a force $F_D$ acts to pull the substrate 1 downward. By making these two forces $F_U$ and $F_D$ equal, the occurrence of wrinkles in the surface of the substrate 1 can be prevented. It is preferable that the upper and lower angles $\theta_U$ and $\theta_L$ be equal, and that their values be from 0.1 to 6°.

As shown in FIG. 3, the upper-side variable-type gripping rollers 52U are similarly installed inclined upward at an angle $\theta_U$, and the lower-side variable-type gripping rollers 52L are also similarly installed inclined downward at an angle $\theta_L$. In the case of the variable-type gripping rollers 52, the difference resulting by subtracting the force $F_D$ pulling downward on the substrate 1 from the force $F_U$ pulling upward on the substrate 1 is the force $F_X$ causing the height of the substrate 1 to actually be raised. Here, when the angle $\theta_U$ of the gripping rollers is constant, the force $F_U$ pulling upward on the substrate 1 is greater for a higher force $F_P$ applied by the gripping rollers to grasp the substrate 1. Likewise, if the gripping roller angle $\theta_L$ is constant, then the higher the force $F_P$ applied by the gripping rollers to grasp the substrate 1, the greater is the force $F_D$ pulling the substrate 1 downward. Hence, by changing the applied force $F_P$ of the gripping rollers, the force $F_X(=F_U-F_D)$ causing raising of the height of the substrate 1 can be changed, that is, the height of the substrate 1 can be controlled.

Further, the larger the angles $\theta_U$, $\theta_L$ of the gripping rollers, the greater are the forces $F_U$, $F_D$ pulling the substrate 1; but if the angles $\theta_U$, $\theta_L$ exceed 6°, or if the static friction force of the rollers themselves is exceeded, the forces $F_U$, $F_D$ pulling the substrate 1 are hardly increased at all. Hence, angles $\theta_U$, $\theta_L$ of from 0.1 to 6° are preferred. It is preferable that the upper and lower angles $\theta_U$, $\theta_L$ be equal. A case has been explained in which variable-type gripping rollers 52 are installed on the upper side and on the lower side; of course, only upper-side variable-type gripping rollers 52U may be installed, and by changing the applied force $F_P$ thereof, the height of the substrate 1 can similarly be controlled.

Figure 4:
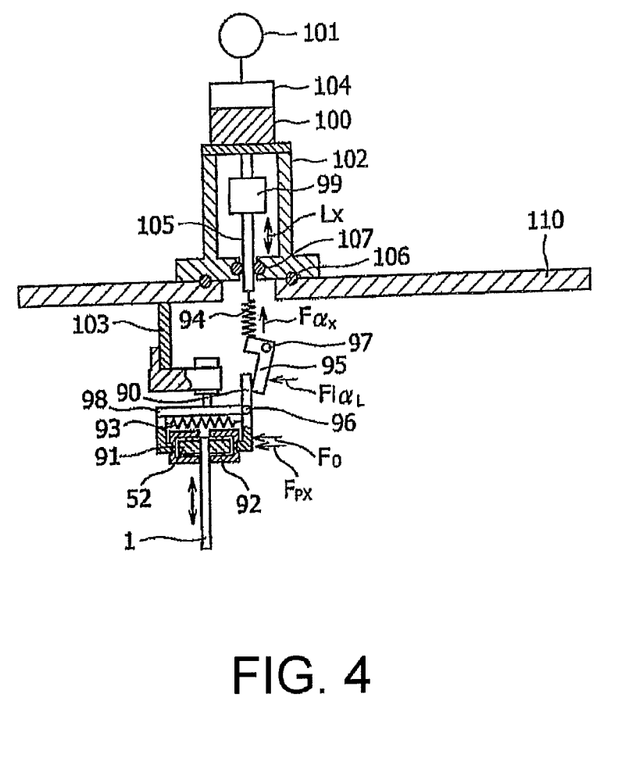
FIG. 4 is a cutaway side view schematically showing an example of gripping rollers and ancillary apparatus.

Next, the configuration of the gripping roller ancillary apparatus is explained. FIG. 4 is a cutaway side view schematically showing an example of upper-side variable-type gripping rollers 52 and the ancillary apparatus for the rollers. As shown in FIG. 4, the pair of gripping rollers 52 are respectively mounted so as to enable rotation within roller housings 92, 92, which are open on the side of the substrate 1. One of the roller housings 91 is fastened to one end of an arm 98 with an L-shape cross section; this arm 98 is fastened to the lower face of a wall 110 of the film deposition chamber via a suspension member 103. The other roller housing 92 is fastened to one end of a plate-shape pressing lever 90; this pressing lever 90 is mounted so as to enable rotation, at the center portion thereof, about the other end of the arm 98, via a hinge 96. And, the arm 98 and pressing lever 90 are connected by a pressing spring 93, and configured such that the pair of gripping rollers 52 grasp the substrate 1 in the horizontal direction through the initial tension $F_0$ of this pressing spring 93.

The other end of the pressing lever 90 is connected to one end of an adjusting lever 95 with an L-shape cross section. This adjusting lever 95 is mounted so as to enable rotation, at the angle portion thereof, about a fixed member (not shown) via a hinge 97. The other end of the adjusting lever 95 is connected to one end of an adjustment spring 94. When the adjustment spring 94 pulls the other end of the adjusting lever 95 in the vertical direction with a force $F\alpha_X$, the adjusting lever 95 rotates with the hinge 97 as a fulcrum, and the one end of the adjusting lever 95 presses the other end of the pressing lever 90 with force $F\alpha_L$ in the horizontal direction.

The other end of the adjusting lever 94 is connected to the tip of a movable rod 105. The opposite end of the movable rod 105 is linked to a linear driving motor 100, configured such that the movable rod 105 advances and retreats in the vertical direction $L_X$ by means of rotation of the linear driving motor 100. The linear driving motor 100 is provided with a brake 104, which locks the linear driving motor 100 at a desired position. And, the linear driving motor 100 is provided with a motor position sensor 101 which detects the position $M_S$ of the number of rotations of the linear driving motor 100 at the current operation. As the motor position sensor 101, an absolute encoder is preferable. On the movable rod 105 is installed a load cell 99 to measure the force $F\alpha_X$ with which the adjustment spring 94 pulls the adjusting lever 95.

The linear driving motor 100, motor brake 104, motor position sensor 101, and load cell 99 are fastened by a flange 102 onto a wall 110 of the film deposition chamber. And, the movable rod 105 is configured so as to pass through the inside of the flange 102 and the wall 110 of the film deposition chamber. The wall 110 of the film deposition chamber and the flange 102 are fastened by means of an O-ring seal or a magnetic seal 106, the flange 102 and movable rod 105 are in contact via an O-ring seal or magnetic seal 107, and by this means the airtight state of the film deposition chamber is preserved.

The configuration of the upper-side variable-type gripping rollers 52U and ancillary apparatus therefor have been explained; the lower-side variable-type gripping rollers 52L and ancillary apparatus therefor can be similarly configured, with top and bottom reversed. It is preferable that the fixed-type and variable-type gripping rollers be fabricated from silicone rubber, fluoride rubber, or another heat-resistant rubber, or from PTFE, a polyimide, or another synthetic resin. Or, the prescribed performance is obtained from stainless steel or iron with a chromium plating.

Figure 5:
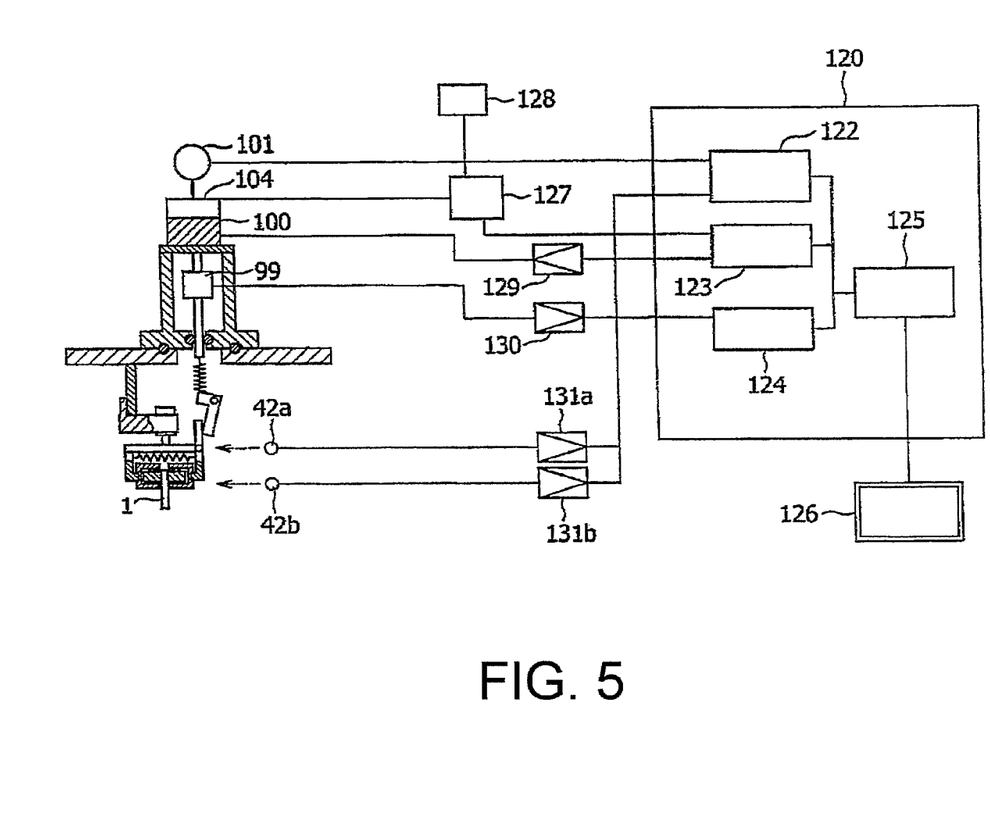
FIG. 5 is a block diagram showing the gripping roller ancillary apparatus and control means for the apparatus.

Next, the configuration to control the height of the substrate 1 is explained. FIG. 5 is a block diagram showing the gripping roller ancillary apparatus and control means for the apparatus. As shown in FIG. 5, the controller 120 internally comprises a digital signal input interface 122, an analog signal output interface 123, an analog signal input interface 124, and a computer processing portion 125 which can transmit and receive to and from these interfaces. The controller 120 also comprises a display/management portion 126 to manage control.

The digital signal input interface 122 is connected to the motor position sensor 101 so as to enable reception. The analog signal output interface 123 is connected via a relay 127 to the motor brake 104 and an AC 100 V brake driving power supply 128 so as to enable transmission. And, the analog signal output interface 123 is connected via an amplifier for a motor 129 to the linear driving motor 100 so as to enable transmission. The analog signal input interface 124 is connected via an amplifier for a load cell 130 to the load cell 99 so as to enable reception.

As shown in FIG. 5, two edge face sensors 42, which detect the edge face of the substrate 1, are placed above and below in the vertical direction. The upper-side edge face sensor 42a is mounted at a position at which the substrate edge face is detected when the substrate 1 rises to exceed a prescribed range, and the lower-side edge face sensor 42b is mounted at a position at which the substrate edge face is detected when the substrate 1 falls to below a prescribed range. The edge face detection range of the edge face sensors 42 can be set to ±5 mm, for example. The upper-side and lower-side edge face sensors 42a, 42b are connected to the digital signal input interface 122 via amplifiers for sensors 131a, 131b, respectively, so as to enable reception.

In FIG. 5, only the single ancillary apparatus for the upper-side variable-type gripping rollers is shown; but each of the ancillary apparatuses for all of the upper-side and lower-side variable-type gripping rollers 52a to 52f are connected to this single controller 120. Also, in FIG. 5 two edge face sensors 42 are placed above and below, but of course other configurations are possible, and three or more edge face sensors may be arranged.

By means of the above configuration, first the strip-shape flexible substrate 1, which passes through a plurality of film deposition chambers 40a to 40p by means of driving portions 20, 60 on the feed side and on the takeup side, is transported horizontally from the feed core 11 in the direction toward the takeup core 75. When performing film deposition, the rotation of the driving rollers 21, 62 is stopped and the strip-shape flexible substrate 1 is put into a stationary state, the walls (not shown) of each of the film deposition chambers 40a to 40p are moved until close contact with the substrate 1 is made, and the interiors of the film deposition chambers are put into airtight states. Then, in each of the film deposition chambers, thin films are formed on the surface of the strip-shape flexible substrate 1.

After film deposition, the walls of the film deposition chambers are returned to the original positions, and the airtight state is ended. The driving rollers 21, 62 are again caused to rotate, and the strip-shape flexible substrate 1 is transported to the position of the next film deposition chamber. And, with each of the film deposition chambers again put into an airtight state, film deposition onto the strip-shape flexible substrate 1, in the stationary state, is performed. By repeating the transport of the strip-shape flexible substrate 1 and film deposition in this way, the thin film laminated body can be manufactured on the surface of the strip-shape flexible substrate 1.

The strip-shape flexible substrate 1 moves over a long distance from the first film deposition chamber 40a to the fourteenth film deposition chamber 40n, but when the strip-shape flexible substrate 1 is supported only by the free rollers 23, 31 positioned at both ends of this interval, gravity and stretching of the substrate result in the problems of more downward drooping and meandering of the substrate in the width direction. Hence, in this embodiment, as explained above, by changing the force $F_P$ with which variable-type gripping rollers 52 grasp the substrate 1, the force F raising the height of the substrate 1 can be controlled, and by this means the height of the substrate 1 can be maintained within a prescribed range. The target value $F_{PX}$ of the force applied by the variable-type gripping rollers 52 can be determined using the following equation (1).

$$F_{PX} = F_0 - R_0 \cdot R_1 \cdot F\alpha_X \quad (1)$$

$F_0$: Initial tension of the pressing spring
$F\alpha_X$: Force with which the adjustment spring pulls the adjustment lever
$R_0$: Lever ratio of the pressing lever
$R_1$: Lever ratio of the adjustment lever $F_0$, $R_0$, and $R_1$ are all fixed values, so that the target value $F_{PX}$ for the pressing force of the variable-type gripping rollers can be controlled by changing only with the tension $F\alpha_X$ of the adjustment spring 94. The target position $L_X$ of the movable rod 105 to achieve the tension $F\alpha_X$ of the adjustment spring 94 which is the target can be determined using the following equation (2).

$$LX = (F\alpha_X - F\alpha_0)/K \quad (2)$$

$F\alpha_0$: Initial tension of the adjustment spring
K: Spring constant of the adjustment spring The position L of the movable rod 105 is related to the product of the rotation rate M of the linear driving motor 100 and the screw lead $G_0$, which is a fixed value, so that the target position $L_X$ of the movable rod 105 can be controlled through the number of rotations $M_X$ of the linear driving motor 100. The screw lead $G_0$ is the amount by which the rod is advanced by a ball screw per rotation of the motor. The position $M_S$ of the number of rotations of the linear driving motor 100 at the current operation can be detected by the motor position sensor 101. Hence, when driving the linear driving motor 100 in rotation to the position $M_X$ of the target number of rotations, it is sufficient to drive the linear driving motor 100 in rotation only by the difference from the current number of rotations $M_S$. The algorithm block for control of this linear driving motor 100 appears in FIG. 6.

Further, by using the load cell 99, the tension $F\alpha_X$ of the adjusting sprint 94 can be controlled more accurately. First, as described above, equation (1) is used to determine the target value $F\alpha_X$ for the tension of the adjustment spring 94 from the target value $F\alpha_X$ for the force applied by the variable-type gripping rollers 52, and then equation (2) is used to determine the target position $L_X$ of the movable rod 105, and the linear driving motor 100 is driven in rotation to the position $M_X$ of the target number of rotations. Next, the load cell 99 is used to measure the current value $F\alpha_S$ of the tension of the adjustment spring 94. The movement distance $\Delta L_X$ of the movable rod 105 to attain the tension $F\alpha_X$ of the adjustment spring 94, which is the target, can be determined using equation (3) below.

$$\Delta L_X = (F\alpha_X - F\alpha_S)/K \quad (3)$$

Figure 6:
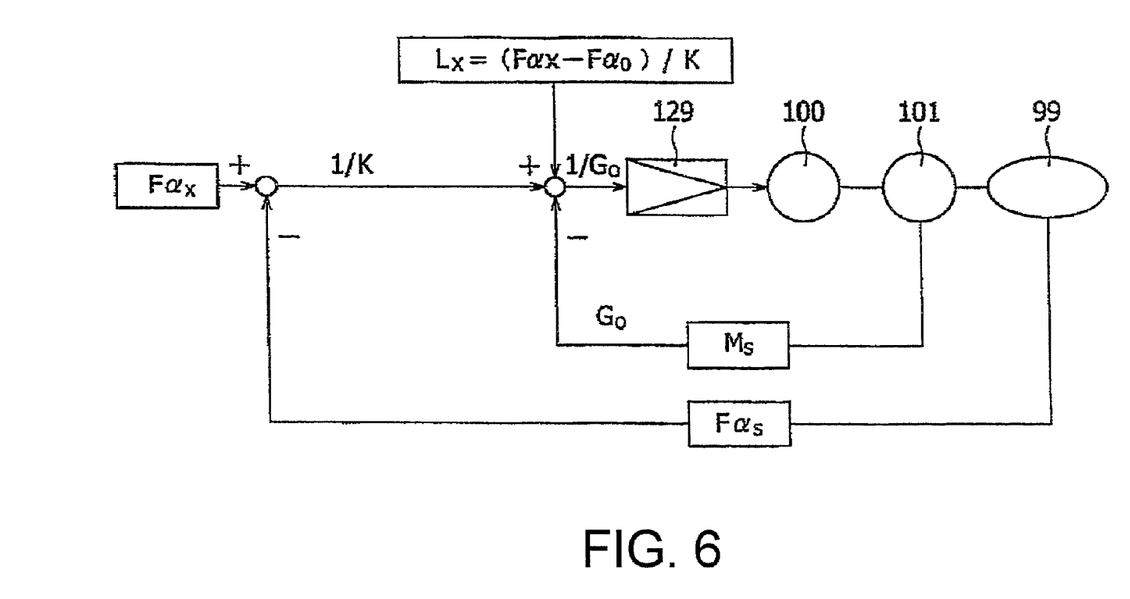
FIG. 6 is a block diagram showing an algorithm for control of a linear driving motor.

$F\alpha_X$: Target value of the tension of the adjustment spring $F\alpha_S$: Measured value of the tension of the adjustment spring
K: Spring constant of the adjustment spring The number of rotations $\Delta M_X$ of the linear driving motor 100 can be determined by dividing the movement distance $\Delta L_X$ of the movable rod 105 by the screw lead $G_0$. Further, after driving the linear driving motor 100 in rotation by this number of rotations $\Delta M_Y$, the load cell 99 again measures the current value $F\alpha_S$ of the tension of the adjustment spring 94. And, equation (3) is used to determine $\Delta L_X$, and the linear driving motor 100 is again driven in rotation. By repeating this process, the actual tension of the adjustment spring 94 can be made close to the target value $F\alpha_X$ more accurately. FIG. 6 shows the algorithm block for control using the load cell 99.

Further, by using the edge face sensors 42, the height of the substrate 1 can be accurately maintained within the prescribed range. As shown in FIG. 5, if the height of the substrate 1 is within the prescribed range, the upper-side edge face sensor 42a does not detect the edge face of the substrate 1 (OFF), and the lower-side edge face sensor 42b detects the edge face of the substrate 1 (ON). When the height of the substrate 1 exceeds the prescribed range and rises, both the upper-side and the lower-side edge face sensors 42a, 42b detect the edge face of the substrate 1 (ON, ON). And, when the height of the substrate 1 exceeds the prescribed range and falls, neither the upper-side nor the lower-side edge face sensors 42a, 42b detect the edge face of the substrate 1 (OFF, OFF).

The ON, OFF signals transmitted from each of the edge face sensors 42 are amplified by the amplifier 131, and are then received by the digital signal input interface 122 of the controller 120. And, in the computer processing portion 125, a judgment is made as to whether the height of the substrate 1 is within the prescribed range, or is above or below the prescribed range.

When judging whether the height of the substrate 1 is above the prescribed range, the target value $F_{PX}$ of the force applied by the upper-side variable-type gripping rollers 52U is lowered. Specifically, as indicated by equation (4), prescribed change amount $\Delta F_{PX}$ is subtracted from the current target value $F_{PX}$ of the force applied by the upper-side variable-type gripping rollers 52U, and the result is set as the new target value $F_{PXR}$. And, as indicated in equation (5), the new target value $F\alpha_{XR}$ for the tension of the adjustment spring 94 is calculated.

$$F_{PXR} = F_{PX} - \Delta F_{PX} \quad (4)$$

$$F_{PXR} = F_0 - R_0 \cdot R_1 \cdot F\alpha_{XR} \quad (5)$$

Based on this new target value $F\alpha_{XR}$, the algorithmic control shown in FIG. 6 above is performed. And, control to set this new target value $F\alpha_{XR}$ is repeated until the height of the substrate 1 falls within the prescribed range, and the upper-side edge face sensor 42a goes to OFF. When the upper-side edge face sensor 42a goes to OFF, an operation signal is sent to the relay 127 from the analog signal output interface 123 of the controller 120, the motor brake 104 is operated, and the linear driving motor 100 is fixed so that the tension $F\alpha_X$ of the adjustment spring 94 does not change.

On the other hand, when it is judged that the height of the substrate 1 is below the prescribed range, the force $F_{PX}$ applied by the upper-side variable-type gripping rollers 52U is raised. Specifically, as indicated by equation (6), the prescribed amount of change $\Delta F_{PX}$ from the current target value $F\alpha_X$ for the force applied by the upper-side variable-type gripping rollers 52U is added, and is set as the new target value $F_{PXR}$. And, as indicated in equation (7), the new target value $F\alpha_{XR}$ for the tension of the adjustment spring 94 is calculated.

$$F_{PXR} = F_{PX} + \Delta F_P \quad (6)$$

$$F_{PXR} = F_0 - R_0 \cdot R_1 \cdot F\alpha_{XR} \quad (7)$$

Based on the new target value $F\alpha_{XR}$, the algorithmic control shown in FIG. 6 above is performed. And, control to set this new target value $F\alpha_{XR}$ is repeated until the height of the substrate 1 rises within the prescribed range, and the lower-side edge face sensor 42b goes to ON. When the lower-side edge face sensor 42b goes to ON, an operation signal is sent to the relay 127 from the analog signal output interface 123, the motor brake 104 is operated, and the linear driving motor 100 is fixed.

The target value $F_{PX}$ for the force applied by the variable-type gripping rollers 52 to grasp the substrate 1 differs depending on the properties of the substrate, the transport distance, and the interval between film deposition chambers; however, the range from 2 to 40 N is preferable, and the range from 4 to 17 N is more preferable. In the above explanation, only the applied force of the upper-side variable-type gripping rollers was changed to cause the height of the substrate to converge within the prescribed range; but when the substrate rises to exceed the prescribed range, the force applied by the lower-side variable-type gripping rollers can also be raised to cause the substrate to be lowered into the prescribed range, and when the substrate has fallen to below the prescribed range, the force applied by the lower-side variable-type gripping rollers can be lowered to cause the substrate to rise to within the prescribed range. Of course, the forces applied by both the upper-side and the lower-side variable-type gripping rollers can be changed, to raise or to lower the difference, to cause the substrate height to converge within the prescribed range.

Further, the force applied by fixed-type gripping rollers 44 to the substrate 1 similarly differs depending on the properties of the substrate, the transport distance, and the interval between film deposition chambers; however, the range from 2 to 40 N is preferable, and the range from 4 to 17 N is more preferable. In order to prevent the occurrence of wrinkles in the surface of the substrate 1, it is preferable that the forces applied by the upper-side and by the lower-side fixed-type gripping rollers 44 be the same.

A stepping roller type film deposition apparatus, in which substrate transport and halting are repeated, has been explained; however, this invention is not limited to stepping roller designs, and can be widely applied, so long as apparatus transports a strip-shape flexible substrate in a horizontal direction over a long distance with the width of the substrate extending in the vertical direction.

PRACTICAL EXAMPLES

Practical Example 1

Film was grasped by an upper-side pair of variable-type gripping rollers, and the change in the force supporting the film that occurred while the film was transported was measured. The gripping roller angle setting $\theta_U$ was changed from 0° to 7° in 1° increments, and at each angle setting $\theta_U$, the force applied by the gripping rollers to grasp the film was increased to 4.4 N, 8.9 N and 16.3 N. The results appear in FIG. 7. The vertical axis in FIG. 7 represents the difference resulting from a subtraction of the force $F_{OX}$ supporting the film during transport from the force $F_{U0}$ supporting the film prior to transporting the film, as the film lifting force $F_U$ (N).

Figure 7:
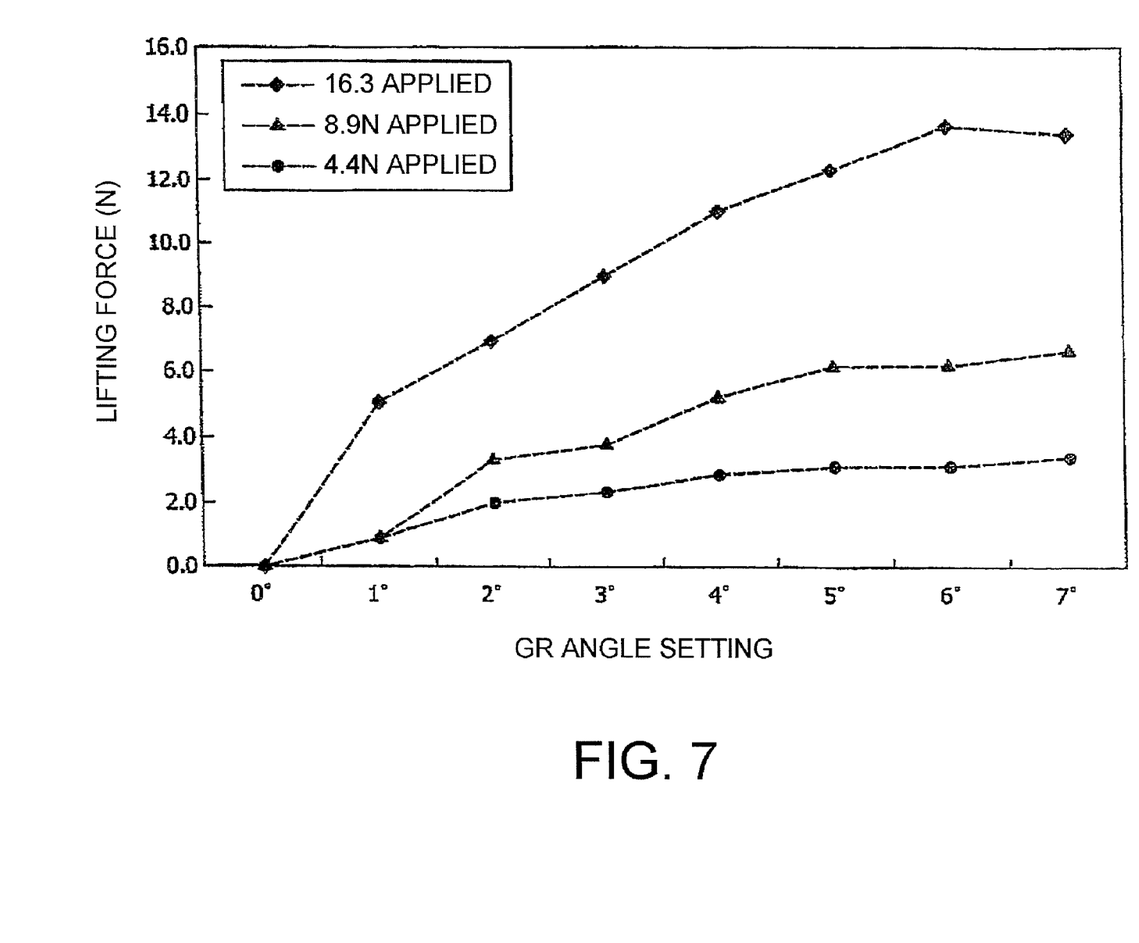
FIG. 7 is a graph showing the relation between the gripping roller-applied pressure, angle setting, and substrate lifting force.

As shown in FIG. 7, except when the gripper roller angle setting $\theta_U$ is 0°, if the angle setting $\theta_U$ is the same, the greater the force $F_P$ applied by the gripping rollers to grasp the film, the greater was the lifting force $F_U$. On the other hand, when the gripping roller angle setting $\theta_U$ is 0°, even when the applied force $F_P$ is increased, there was almost no change in the film lifting force $F_U$. Further, when the gripping roller angle setting $\theta_U$ was from 1 to 6°, for the same applied force $F_P$, the larger the angle setting $\theta_U$, the greater was the film lifting force $F_U$; but the case of an angle setting $\theta_U$ of 7° was nearly the same as for the case of an angle setting $\theta_U$ of 6°.

Practical Example 2

Figure 8:
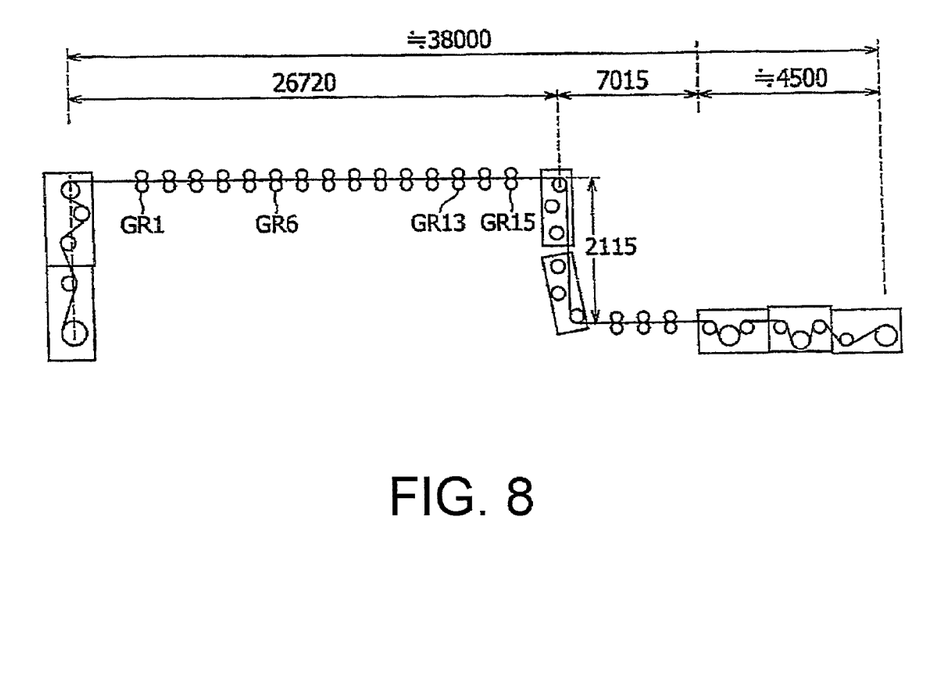
FIG. 8 is a plan view schematically showing an experimental apparatus used in the experiments of Practical Example 2.

Tests were performed to quantitatively measurement fluctuations in the height of film, using the experimental apparatus shown in FIG. 8. The experimental apparatus shown in FIG. 8 has essentially the same configuration as the apparatus shown in FIG. 1, except for the fact that there are no film deposition chambers. In the experimental apparatus shown in FIG. 8, ten sets each of upper and lower fixed-type gripping rollers were installed in intervals for CVD film deposition chambers, and five sets of only upper variable-type gripping rollers were installed. Among the total of 15 sets of gripping rollers, variable-type gripping rollers were placed in the fifth, seventh, ninth, eleventh, and thirteenth positions. In intervals for sputtering film deposition chambers, three sets each of upper and lower fixed-type gripping rollers were installed.

The lengths of the intervals in the experimental apparatus are as shown in the figure. The total film transport distance was approximately 40 m. The rollers of the gripping rollers were of silicone rubber. The gripping roller angle settings $\theta$ were all fixed at 1°. As the film, Kapton® film was used.

In these tests, the force applied by the fifth, seventh, ninth, eleventh, and thirteenth variable-type gripping rollers was changed manually, with the targets of raising the height 10 mm from the initial height while the film was transported approximately 32 m, and then lowering the height to the initial height during transporting over the next approximately 32 m, and then lowering the height 10 mm over approximately 32 mm, and then again raising the height 10 mm during transport over approximately 32 mm to the initial height. The test results appear in FIG. 9.

Figure 9:
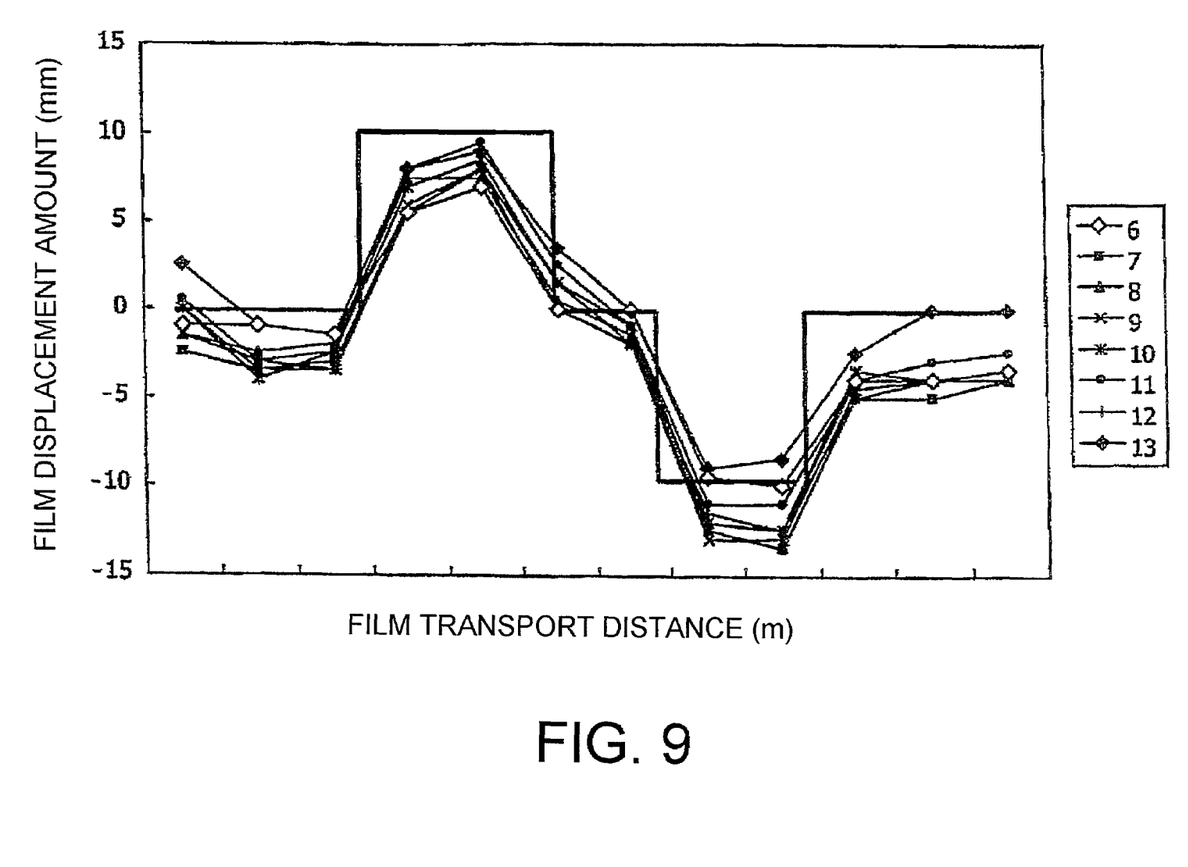
FIG. 9 is a graph showing experimental results for the experimental apparatus of FIG. 8.

The vertical axis of the graph in FIG. 9 shows the displacement amount (mm), which is the difference between the initial height of the film and a relatively changed height. The horizontal axis indicates the film transport distance (m). The bold line in the graph indicates control targets for film displacement amounts. In tests, operations were repeated in which the film was transported for approximately 16 m, then stopped, and after manually changing the gripping roller applied force, the film was again transported. With a single film transport task taken as one step, FIG. 9 plots the film displacement amount measured for each step at each of the gripping roller positions from the sixth to the thirteenth positions.

As shown in FIG. 9, film transport was performed for twelve steps, and the film was transported over approximately 200 m. During this time, the film displacement amount changed substantially similarly to the bold line which was the control target, according to changes in the gripping roller applied force. Hence, it was confirmed that by changing the gripping roller applied force, the film displacement amount can be controlled according to a target.

The invention claimed is:

1. A thin film laminated body manufacturing apparatus, which manufactures a thin film laminated body by depositing a plurality of thin films onto a surface of a strip-shape flexible substrate, the apparatus comprising:

substrate transporting means for transporting the substrate in a horizontal substrate transport direction, the substrate with a width extending in a vertical direction;

a plurality of film deposition chambers, arranged consecutively along the substrate transport direction, and in which film is deposited onto the substrate surface;

at least one pair of gripping rollers, arranged in at least one space among spaces between the film deposition chambers, and which grasps an upper edge portion of the substrate, with the gripping roller rotation direction being diagonally upward relative to the substrate transport direction; and a control device configured to control a height of the substrate by changing a force with which at least on of the pairs of gripping rollers grasps the substrate.

2. A thin film laminated body manufacturing apparatus, which manufactures a thin film laminated body by depositing a plurality of thin films onto a surface of a strip-shape flexible substrate, the apparatus comprising:

substrate transporting means for transporting the substrate in a horizontal substrate transport direction, with a width of the substrate extending in a vertical direction, the substrate having an upper edge portion and a lower edge portion;

a plurality of film deposition chambers, arranged consecutively along the substrate transport direction, and in which a film is deposited onto the surface of the substrate, the substrate having a upper edge portion and a lower edge portion;

a plurality of first pairs of gripping rollers, arranged in respective spaces between the film deposition chambers, and which grasp the upper edge portion of the substrate;

at least one second pair of gripping rollers, arranged in at least one of the spaces between the film deposition chambers, and which grasps the lower edge portion of the substrate, with the direction of rotation of the first pairs of gripping rollers being diagonally upward relative to the direction of substrate transport, and with the direction of rotation of the second pair gripping rollers being diagonally downward relative to the direction of substrate transport; and a control device configured to control a height of the substrate by changing the force with which at least one pair of gripping rollers among the first and second pairs of gripping rollers grasps the substrate.

3. The thin film laminated body manufacturing apparatus according to claim 2, further comprising:

an actuator that changes the gripping force of the gripping rollers grasping the substrate;

powering means for inputting energy to the actuator; and a load cell that detects the energy input to the actuator, wherein in order to set the gripping force of the gripping rollers grasping the substrate to a target value, the control device calculates a target value of the energy to be input to the actuator, and after the input energy at the target value has been input to the actuator by the powering means, compares with the input energy target value a detected value of the input energy detected by the load cell, and changes the target value for energy to be input to the actuator.

4. The thin film laminated body manufacturing apparatus according to claim 3, further comprising a sensor that detects the height of the substrate, wherein the control device changes the target value for the gripping force of the gripping rollers grasping the substrate when a judgment is made by the sensor that the height of the substrate detected is not within a prescribed range.

5. A method of manufacturing a thin film laminated body, in which a plurality of thin films are deposited onto a surface of a strip-shape flexible substrate, the method comprising the steps of:

transporting the substrate in a horizontal substrate transport direction, with a width of the substrate extending in a vertical direction;

depositing a film onto the surface of the substrate in a plurality of film deposition chambers, arranged consecutively along the substrate transport direction; and controlling a height of the substrate by changing a force with which the substrate is grasped by at least one pair of gripping rollers, which are arranged in at least one space among spaces between the plurality of film deposition chambers, and which grasp an upper side edge portion of the substrate, with the gripping roller rotation direction being diagonally upward relative to the substrate transport direction.

6. A method of manufacturing a thin film laminated body, in which a plurality of thin films are deposited onto a surface of a strip-shape flexible substrate, the method comprising the steps of:

transporting the substrate in a horizontal substrate transport direction, with a substrate width extending in a vertical direction;

depositing a film onto the surface of the substrate in a plurality of film deposition chambers, arranged consecutively along the substrate transport direction; and controlling a height of the substrate by changing a force with which the substrate is grasped by at least one of first and second pairs of gripping rollers, which are arranged in at least one space among spaces between the film deposition chambers, the first pair of gripping rollers grasping upper edge portions of the substrate, the second pair of gripping rollers grasping lower edge portions of the substrate, with the direction of rotation of the first pair of gripping rollers being diagonally upward relative to the direction of substrate transport, and with the direction of rotation of the second pair gripping rollers being diagonally downward relative to the direction of substrate transport.

7. The method of manufacturing a thin film laminated body according to claim 6, wherein the step of controlling the height of the substrate further comprises the steps of:

calculating a target value of energy input to an actuator that changes a force with which the gripping rollers grasp the substrate, in order to set to a target value the gripping force of the gripping rollers grasping the substrate;

inputting an energy target value to the actuator by powering means; and detecting with a load cell the energy input to the actuator, comparing the detected value of the input energy with the input energy target value, and changing the target value for energy to be input to the actuator.

8. The method of manufacturing a thin film laminated body according to claim 7, wherein the step of controlling the height of the substrate further comprises:

detecting with a sensor the height of the substrate and judging whether the substrate height is within a prescribed range; and when a judgment is made that the substrate height is not within the prescribed range, changing the target value of the force with which the gripping rollers grasp the substrate.

9. The method of manufacturing a thin film laminated body according to claim 5, wherein the step of controlling the height of the substrate further comprises the steps of: calculating a target value of energy input to an actuator that changes a force with which the gripping rollers grasp the substrate, in order to set to a target value the gripping force of the gripping rollers grasping the substrate;

inputting an energy target value to the actuator by powering means; and detecting with a load cell the energy input to the actuator, comparing the detected value of the input energy with the input energy target value, and changing the target value for energy to be input to the actuator.

10. The method of manufacturing a thin film laminated body according to claim 9, wherein the step of controlling the height of the substrate further comprises:

detecting with a sensor the height of the substrate and judging whether the substrate height is within a prescribed range; and when a judgment is made that the substrate height is not within the prescribed range, changing the target value of the force with which the gripping rollers grasp the substrate.

11. The thin film laminated body manufacturing apparatus according to claim 1, further comprising:

an actuator that changes the gripping force of the gripping rollers grasping the substrate;

powering means for inputting energy to the actuator; and a load cell that detects the energy input to the actuator, wherein in order to set the gripping force of the gripping rollers grasping the substrate to a target value, the control device calculates a target value of the energy to be input to the actuator, and after the input energy at the target value has been input to the actuator by the powering means, compares with the input energy target value a detected value of the input energy detected by the load cell, and changes the target value for energy to be input to the actuator.

12. The thin film laminated body manufacturing apparatus according to claim 11, further comprising a sensor that detects the height of the substrate, wherein the control device changes the target value for the gripping force of the gripping rollers grasping the substrate when a judgment is made by the sensor that the height of the substrate detected is not within a prescribed range.

* * * * *